(12) United States Patent
Chou et al.

(10) Patent No.: US 8,916,429 B2
(45) Date of Patent: Dec. 23, 2014

(54) AQUEOUS CLEANING TECHNIQUES AND COMPOSITIONS FOR USE IN SEMICONDUCTOR DEVICE MANUFACTURING

(75) Inventors: Chun-Li Chou, Jhubei (TW); Shao-Yen Ku, Jhubei (TW); Pei-Hung Chen, Hsinchu (TW); Jui-Ping Chuang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

(21) Appl. No.: 13/459,379

(22) Filed: Apr. 30, 2012

(65) Prior Publication Data

US 2013/0288436 A1    Oct. 31, 2013

(51) Int. Cl.
*H01L 21/336* (2006.01)

(52) U.S. Cl.
USPC ........... 438/197; 438/199; 438/301; 438/585; 438/586; 438/637; 438/745

(58) Field of Classification Search
CPC .................. H01L 21/02057; H01L 21/02063; H01L 21/02052; H01L 21/0206; H01L 21/823828; C11D 11/0047

USPC ......... 438/197, 199, 301, 585, 586, 637, 745; 257/E21.228, E21.313, E21.409; 134/1.2, 2, 3; 510/175
See application file for complete search history.

(56) References Cited

U.S. PATENT DOCUMENTS

| | | | |
|---|---|---|---|
| 6,489,191 B2 * | 12/2002 | Shao et al. | 438/199 |
| 6,864,193 B2 | 3/2005 | Chou et al. | |
| 7,022,610 B2 | 4/2006 | Chou et al. | |
| 7,621,281 B2 * | 11/2009 | Ikemoto et al. | 134/1.3 |
| 7,719,060 B2 * | 5/2010 | Wei et al. | 257/368 |
| 7,943,562 B2 * | 5/2011 | Lee et al. | 510/175 |
| 7,968,506 B2 | 6/2011 | Chou et al. | |
| 2002/0123191 A1 * | 9/2002 | Huang et al. | 438/239 |
| 2005/0197265 A1 * | 9/2005 | Rath et al. | 510/175 |
| 2006/0287208 A1 * | 12/2006 | Lee et al. | 510/175 |
| 2008/0051313 A1 * | 2/2008 | Lee et al. | 510/505 |
| 2008/0311711 A1 * | 12/2008 | Hampp et al. | 438/197 |
| 2010/0055897 A1 * | 3/2010 | Chou et al. | 438/638 |

* cited by examiner

*Primary Examiner* — Chuong A Luu
(74) *Attorney, Agent, or Firm* — Eschweiler & Associates, LLC

(57) ABSTRACT

Some embodiments relate to a manufacturing method for a semiconductor device. In this method, a semiconductor workpiece, which includes a metal gate electrode thereon, is provided. An opening is formed in the semiconductor workpiece to expose a surface of the metal gate. Formation of the opening leaves a polymeric residue on the workpiece. To remove the polymeric residue from the workpiece, a cleaning solution that includes an organic alkali component is used.

14 Claims, 5 Drawing Sheets

AQUEOUS CLEANING TECHNIQUES AND COMPOSITIONS FOR USE IN SEMICONDUCTOR DEVICE MANUFACTURING

BACKGROUND

Integrated circuit chips frequently utilize multiple levels of patterned conductive layers to provide electrical interconnects between semiconductor devices within a semiconductor substrate. The present disclosure relates to improved cleaning techniques and cleaning compositions used in manufacturing semiconductor devices.

DETAILED DESCRIPTION

Figure 1:
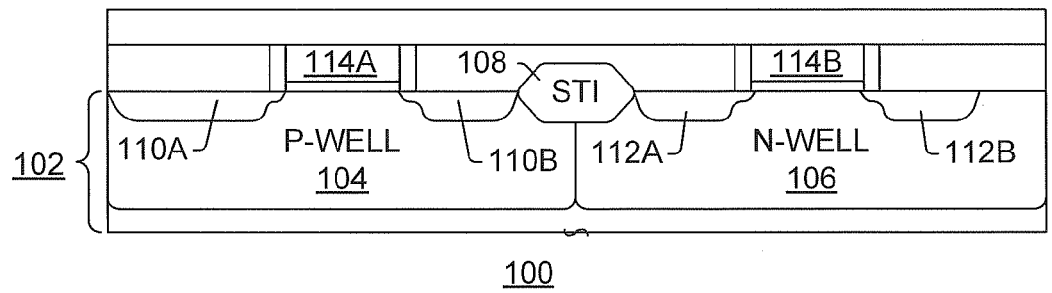
FIGS. 1-3 are cross-sectional diagrams illustrating a method of forming a semiconductor device that suffers from some shortcomings.

The invention will now be described with reference to the attached drawings, wherein like reference numerals are used to refer to like elements throughout.

Figure 2:
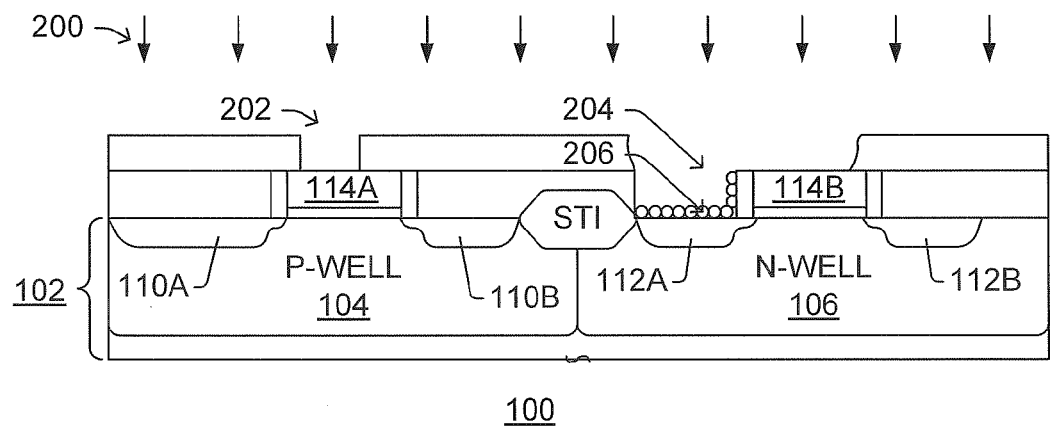
Figure 3:
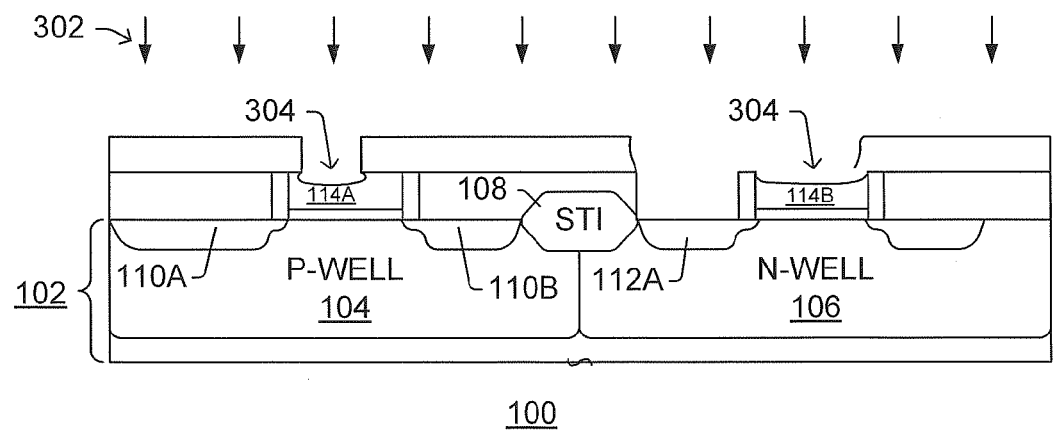

FIGS. 1-3 show a series of cross-sectional views that illustrate a method of forming a semiconductor device that suffers from some shortcomings. In FIG. 1, a workpiece 100 that includes a silicon substrate 102 is provided. The substrate includes gate electrodes 114A, 114B and source/drain regions 110A/B, 112A/B.

To form an electrical connection to gate electrode 114A and source/drain region 112A, one or more etches 200 are performed to form openings 202 and 204, as shown in FIG. 2. Unfortunately, however, these one or more etches 200 can leave a polymeric etch residue 206 along the sidewalls and bottom of opening 204. This polymeric etch residue 206 can cause a subsequently formed source/drain contact formed in opening 204 to exhibit a higher resistance than expected (e.g., to be a non-ohmic contact), and can thus lead to problems during device operation.

To remove this polymeric etch residue 206, conventional methods have attempted to use a diluted ammonium peroxide mixture (DAPM) cleaning solution 302, as shown in FIG. 3. Although the DAPM solution 302 removes the polymeric etch residue 206, it also causes "dishing" 304 for the gate electrodes 114A, 114B. This dishing 304 can cause electrical contact problems for the gate electrodes, and therefore is less than ideal. In view of these shortcomings, the present disclosure provides for improved cleaning techniques for semiconductor devices.

Figure 4:
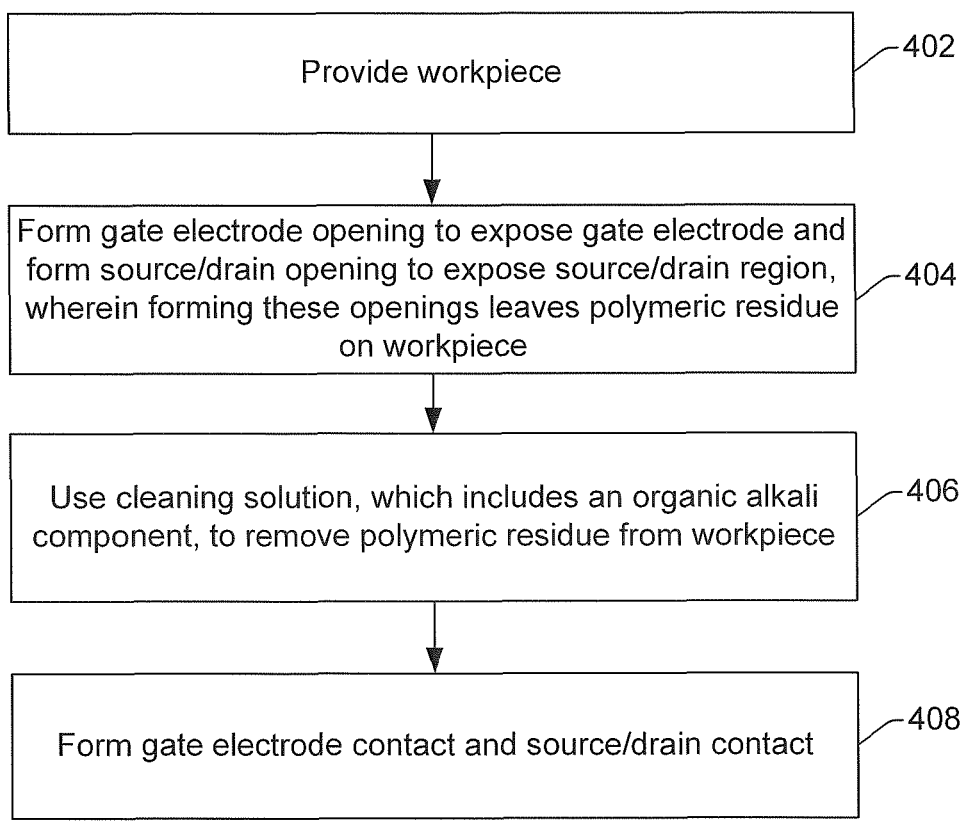
FIG. 4 is an exemplary method of forming a semiconductor device in accordance with some embodiments.

An exemplary method is shown in FIG. 4. In 402, a semiconductor workpiece having is provided. In 404, a gate electrode opening is formed to expose a gate electrode on workpiece. A source/drain opening is also formed to concurrently expose a source/drain region. Unfortunately, forming these openings leaves polymeric residue on workpiece. To remove the polymeric residue, in 406, an aqueous cleaning solution, which includes an organic alkali component rather than DAPM, is applied to the workpiece.

The aqueous cleaning composition can include a) an organic alkali, b) an acid additive, c) an azole, and d) water. The aqueous cleaning composition limits or eliminates damage to the gate electrodes and removes any remaining polymeric residue left following one or more etch steps. In some embodiments, the pH of the composition is from about 7 to about 10. The components of the aqueous cleaning composition can be of any suitable type of species. Specific illustrative formulation components for each of the ingredients of the composition are described below.

In one embodiment, the organic alkali component includes one or more of 4-methoxypyridine-N-oxide hydrate, 4-methylmorpholine N-oxide monohydrate, ethanol 2-(dimethylamino)-N-oxide, trimethylamine N-oxide, and tetrahydrothiophene-1,1-dioxide. A quantity of the organic alkali component of the composition is in the range from about 0.01% to 50%.

In one embodiment, the acid additive includes one or more of tetramethylammonium fluoride, tetraethylammonium fluoride hydrate, tetrabutylammonium fluoride, ammonium sulfate, hydroxylammonium sulfate, and methyl hypochlorite. A quantity of the acid additive is in a range from about 0.01% to 5%.

In one embodiment, the azole includes one or more of imidazole, 1H-tetrazole, 1,2,3-1H-triazole, and 1,2,4-1H-triazole. The azole acts as a chelating agent that binds with and inhibits corrosion of metal layers (e.g., aluminum metal layers) being cleaned. A quantity of the azole in the composition is in a range from about 0.01% to 5% by weight of the total composition.

In 408, after the polymeric residue has been removed by the cleaning solution, a gate electrode contact and source/drain contact are formed. These contacts are physically coupled to the gate electrode and source/drain region, respectively (e.g., to an upper surface of the gate electrode and source/drain, respectively). Because the polymeric residue has been removed prior to the formation of these contacts, these contacts are typically ohmic contacts. Hence, FIG. 4's method promotes desired electrical characteristics for semiconductor devices.

FIGS. 5-13 show a series of cross-sectional views illustrating an exemplary method of forming a semiconductor device. For purposes of understanding and clarity, this series of cross-sectional views has been streamlined in that other embodiments may include additional steps, and not all illustrated steps are present in all manufacturing flows. Hence, any number of variations are contemplated as falling within the scope of the present disclosure, and the disclosure is not limited to the examples illustrated or described herein.

Figure 5:
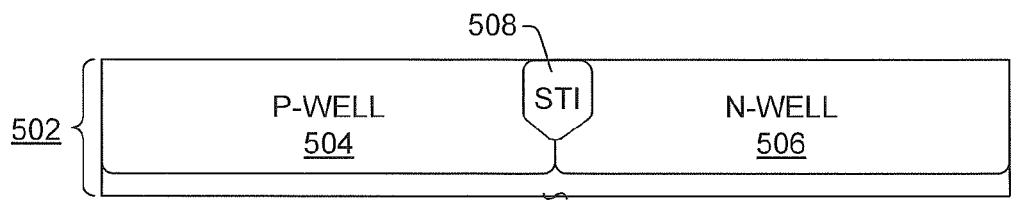
FIGS. 5-13 are cross-sectional diagrams illustrating a method of forming a semiconductor device in accordance with an exemplary embodiment described herein.

Turning to FIG. 5, a substrate 502 is provided in the form of a bulk silicon wafer. A p-well 504 and n-well 506 are formed in the substrate 502, and shallow trench isolation (STI) region 508 is formed between the p-well 504 and n-well 506. Although FIG. 5 illustrates a bulk silicon wafer substrate, "semiconductor substrate" as referred to herein may comprise any type of semiconductor material including a bulk silicon wafer, a binary compound substrate (e.g., GaAs wafer), a ternary compound substrate (e.g., AlGaAs), or higher order compound wafers, among others. Further, the semiconductor substrate 502 can also include non semiconductor materials such as oxide in silicon-on-insulator (SOI), partial SOI substrate, polysilicon, amorphous silicon, or organic materials, among others. In some embodiments, the semiconductor substrate 206 can also include multiple wafers or dies which are stacked or otherwise adhered together. The semiconductor substrate 502 can include wafers which are cut from a silicon ingot, and/or any other type of semiconductor/non-semiconductor and/or deposited or grown (e.g. epitaxial) layers formed on an underlying substrate.

Figure 6:
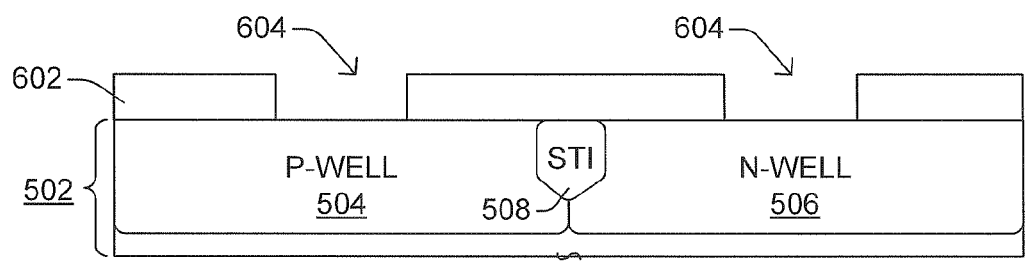

In FIG. 6, a first dielectric layer 602, which can comprise a polysilicate glass (PSG) in some embodiments, is formed on an upper surface of substrate 502. A photomask (not shown) is patterned over the first dielectric layer 602 and an etch is carried out with the photomask in place to form first dielectric layer openings 604, 606.

Figure 7:
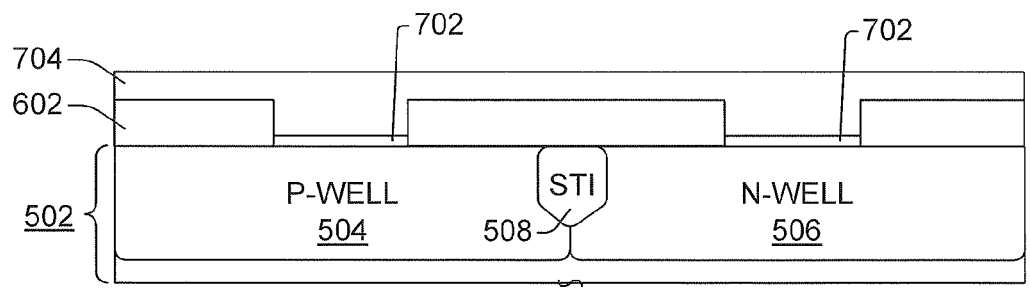

In FIG. 7, a relatively thin gate oxide layer 702 is formed on the exposed substrate surfaces in the openings 604, 606. A gate electrode layer 704 is then formed over the workpiece. The gate electrode layer 704 often comprises aluminum, but could also comprise other metals, for example, copper or tungsten in various embodiments.

Figure 8:
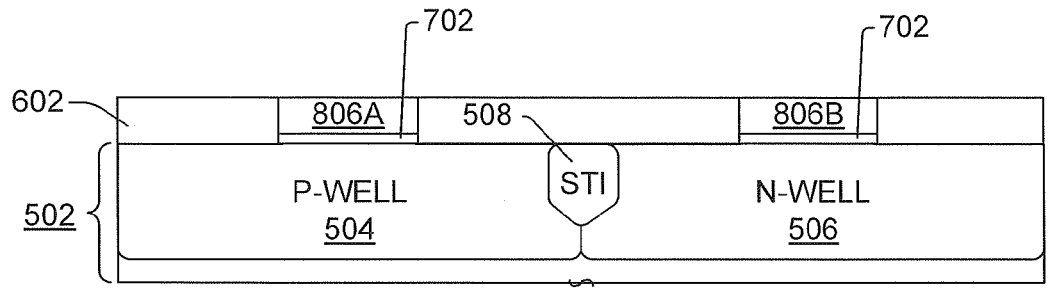

In FIG. 8, chemical mechanical polishing (CMP) has been carried out to planarize the gate electrode layer 704, thereby forming gate electrodes 806A, 806B.

Figure 9:
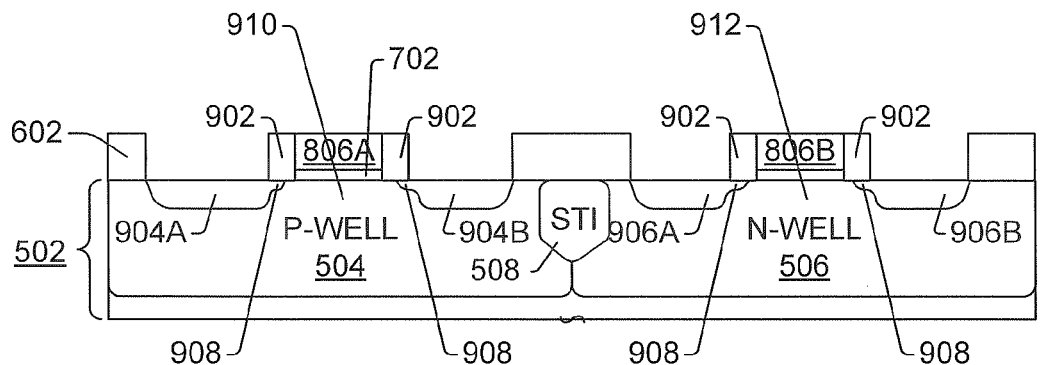

In FIG. 9, sidewall spacers 902 are formed on the sidewalls of the gate electrodes. N-type source and drain regions 904A, 904B are formed in the p-well 504, and p-type source and drain regions 906A, 906B are formed in the n-well 506. To form the n-type source and drain regions 904A, 904B, a n-implant mask is typically formed over the n-well 506, and n-type dopants are implanted into the substrate 502. Similarly, to form the p-type source and drain regions 906A, 906B, the n-implant mask is removed, and a p-implant mask is formed over the p-well 504. With the p-implant mask in place, p-type dopants are implanted into the substrate 502. Angled implants can also be used to form source drain extension regions 908, which extend under the lateral edges of the gate electrodes. Thus, a NMOS channel region 910 is formed in p-well under gate electrode 806A, and a PMOS channel region 912 is formed in n-well under gate electrode 806B.

Figure 10:
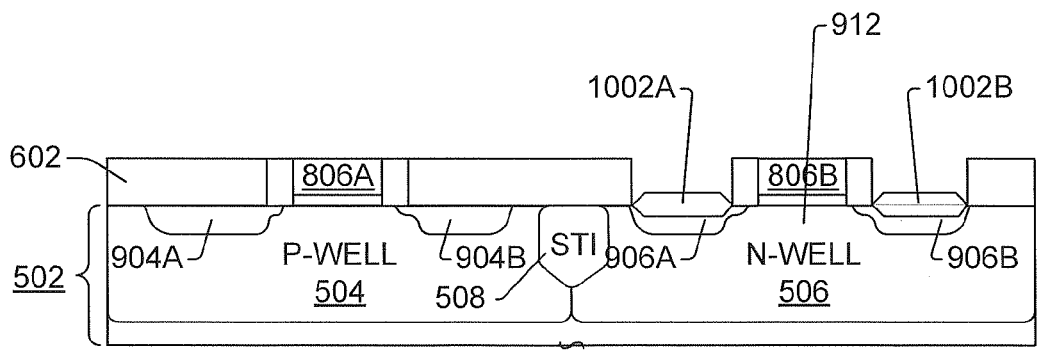
Figure 11:
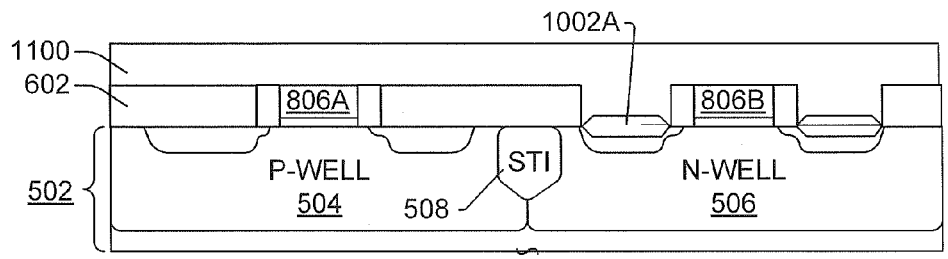

In FIG. 10, strain inducing regions 1002A, 1002B are formed near the p-type source and drain regions 906A, 906B. In some embodiments, these strain inducing regions 1002A, 1002B can comprise Silicon germanium (SiGe). Lattice mismatch between the strain inducing regions 1002A, 1002B and surrounding silicon substrate 502 induces strain in PMOS channel region 912, thereby increasing mobility of carriers in the PMOS channel region 912 during device operation. Strain inducing materials other than SeGe could also be used In FIG. 11, a second dielectric layer 1100, which is made of polysilicate glass (PSG) in some embodiments, is disposed around the gate electrodes 806A, 806B.

Figure 12:
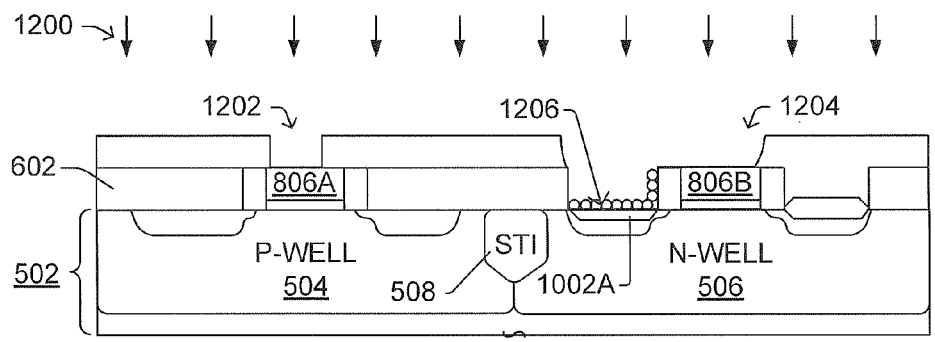

In FIG. 12 one or more etches 1200 are performed to form openings 1202 and 1204 in the NMOS and PMOS regions, respectively. Although the etches 1200 are sufficient to form these openings 1202, 1204 as desired, the etches, however, leave a polymeric etch residue 1206 along the sidewalls and bottom of opening 1204.

Figure 13:
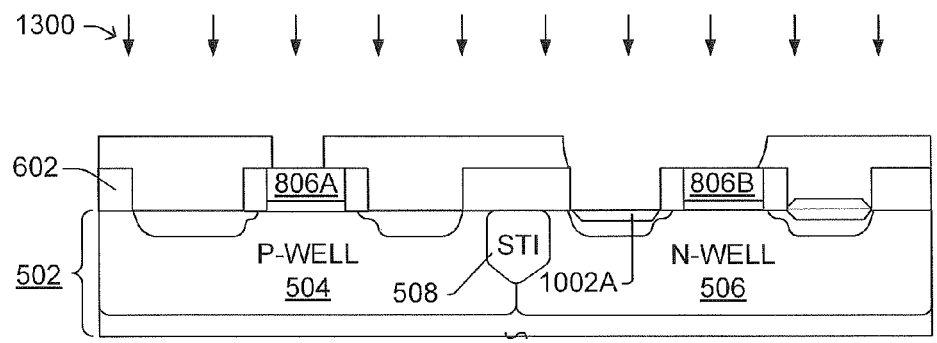

To remove this polymeric etch residue 1206, FIG. 13 shows a cleaning composition 1300, which includes an organic alkali component being applied. The aqueous cleaning composition 1300 can include a) an organic alkali, b) an acid additive, c) an azole, and d) water. The cleaning composition 1300 limits or prevents damage to the gate electrodes 806A, 806B and removes any remaining polymer residue left following the one or more etch steps. Hence, the illustrated method promotes desired electrical characteristics for semiconductor devices.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method for manufacturing a semiconductor device, comprising:
   providing a semiconductor substrate;
   forming a first dielectric layer over the semiconductor substrate, the first dielectric layer including two gate openings;
   subsequent to forming the first dielectric layer, respectively forming first and second metal gates in the gate openings of the first dielectric layer;
   forming first source/drain regions corresponding to the first metal gate on opposing sides of the first metal gate;
   forming second source/drain regions corresponding to the second metal gate on opposing sides of the second metal gate;
   forming a second dielectric layer over the first dielectric layer, the first and second metal gates, and the first and second source/drain regions;
   forming first and second openings in the second dielectric layer to respectively expose surfaces of the second metal gate and one of the first source/drain regions, without exposing the second source/drain regions, wherein formation of the first opening leaves a polymeric residue on the one of the first source/drain regions; and
   using a cleaning solution to remove the polymeric residue from the one of the first source/drain regions, wherein the cleaning solution includes at least one organic alkali, at least one an acid additive, an azole, and deionized water and wherein the cleaning solution has a pH that is greater than 7 and less than 9.

2. The method of claim 1, further comprising:
   forming the first and second openings to concurrently expose the second metal gate and the one of the first source/drain regions.

3. The method of claim 1, wherein the cleaning solution is in fluid contact with both the second metal gate and the one of the first source/drain region.

4. The method of claim 1, wherein the at least one organic alkali is present in the cleaning solution in an amount from about 0.01% to 50% by weight based on a total weight of the cleaning solution, the at least one acid additive is present in the cleaning solution in an amount from about 0.01% to 5% by weight based on the total weight of the cleaning solution, and the azole is present in the cleaning solution in an amount from about 0.01% to 5% by weight based on the total weight of the cleaning solution.

5. The method of claim 1, wherein the organic alkali comprises one or more of 4-methoxypyridine-N-oxide hydrate, 4-methylmorpholine N-oxide monohydrate, ethanol 2-(dimethylamino)-N-oxide, trimethylamine N-oxide, and tetrahydrothiphene-1,1-dioxide.

6. The method of claim 1, wherein the acid additive comprises one or more of tetramethylammonium fluoride, tetraethylammonium fluoride hydrate, tetrabutylammonium fluoride, ammonium sulfate, hydroxylammonium sulfate, and methyl hypochlorite.

7. The method of claim 1, wherein the azole comprises one or more of imidazole, 1H-tetrazole, 1,2,3-1H-triazole, and 1,2,4-1H-triazole.

8. The method of claim 1, further comprising:
removing the polymeric residue without etching the second metal gate.

9. The method of claim 1, further comprising:
forming the first and second metal gates by:
   forming a gate electrode layer filling the gate openings; and
   performing a chemical machine polish (CMP) of the gate electrode layer.

10. The method according to claim 1, wherein the first and second metal gates are respectively formed over a first well region of the semiconductor substrate and a second well region of the semiconductor substrate, wherein the first well region has a first conductivity type and the second well region has a second conductivity type.

11. A method for manufacturing a semiconductor device, comprising:
providing a semiconductor substrate;
forming a first well region having a first conductivity type and a second well region having a second conductivity type in the substrate;
forming a first dielectric layer over the first well region and the second well region;
patterning the first dielectric layer to form two first dielectric layer openings corresponding to the first and second well regions, the first dielectric layer openings exposing surfaces of the first and second well regions;
subsequent to the patterning, forming a first gate dielectric and a second gate dielectric respectively within the first dielectric layer openings over exposed surfaces of the first and second well regions, wherein top surfaces of the first and second gate dielectric are recessed relative to top surfaces of the patterned first dielectric layer;
forming a first metal gate over the first well region and the first gate dielectric, wherein the first gate dielectric electrically isolates the first metal gate from the first well region, wherein a top surface of the first metal gate is coplanar with top surfaces of the patterned first dielectric layer;
forming a second metal gate over the second well region and the second gate dielectric, wherein the second gate dielectric electrically isolates the second metal gate from the second well region, wherein a top surface of the second metal gate is coplanar with top surfaces of the patterned first dielectric layer;
forming first source/drain regions in the first well region, wherein the first source/drain regions have the second conductivity type and are self-aligned with the first metal gate;
forming second source/drain regions in the second well region, wherein the second source/drain regions have the first conductivity type are self-aligned with the second metal gate;
forming strain inducing regions over the first source/drain regions without forming strain inducing regions over the second source/drain regions and the first and second metal gates;
forming a second dielectric layer over the patterned first dielectric layer, the mask, the strain inducing regions, and the first and second metal gates;
forming a first opening in the second dielectric layer to expose a surface of the second metal gate, wherein formation of the opening leaves a polymeric residue on the one of the strain inducing regions; and
using a cleaning solution, which includes an organic alkali component and an acid additive and which has a pH of greater than 7 and less than 9, to remove the polymeric residue from the one of the strain inducing regions.

12. The method of claim 11, further comprising:
forming a second opening in the second dielectric layer to expose the one of the strain inducing regions concurrently with the second metal gate while leaving the second dielectric regions.

13. The method of claim 12, wherein the cleaning solution is applied while the first opening and second opening are concurrently present.

14. The method of claim 11, further comprising:
removing the polymeric residue without etching the second metal gate.

* * * * *